United States Patent

Golladay

[11] Patent Number: 6,069,363
[45] Date of Patent: May 30, 2000

[54] MAGNETIC-ELECTROSTATIC SYMMETRIC DOUBLET PROJECTION LENS

[75] Inventor: Steven D. Golladay, Hopewell Junction, N.Y.

[73] Assignee: International Business Machines Corporation, Armonk, N.Y.

[21] Appl. No.: 09/031,233

[22] Filed: Feb. 26, 1998

[51] Int. Cl.[7] .................................................. H01J 37/12
[52] U.S. Cl. .............................. 250/396 R; 250/396 ML
[58] Field of Search ....................... 250/396 R, 396 ML, 250/398

[56] References Cited

U.S. PATENT DOCUMENTS

| | | |
|---|---|---|
| 4,546,258 | 10/1985 | Chisholm . |
| 4,684,808 | 8/1987 | Plies et al. ........................ 250/396 R |
| 4,785,176 | 11/1988 | Frosien et al. . |
| 4,926,054 | 5/1990 | Frosien . |
| 5,041,731 | 8/1991 | Oae et al. . |
| 5,084,622 | 1/1992 | Rose . |
| 5,146,090 | 9/1992 | Plies . |
| 5,221,844 | 6/1993 | van der Mast et al. . |
| 5,371,371 | 12/1994 | Yamazaki et al. . |
| 5,387,799 | 2/1995 | Sohda et al. . |
| 5,747,819 | 5/1998 | Nakasuji et al. ........................ 250/398 |
| 5,757,009 | 5/1998 | Walstrom ............................ 250/396 R |
| 5,864,142 | 1/1999 | Muraki ................................ 250/491.1 |

*Primary Examiner*—Bruce C. Anderson
*Attorney, Agent, or Firm*—Whitham, Curtis & Whitham; Eric W. Petraske, Esq.

[57] ABSTRACT

Resolution of a symmetric magnetic doublet charged particle beam projection lens is improved by applying a non-uniform electrostatic field having the same symmetry conditions as the lens through the magnetic doublet which provides a maximum particle velocity at the plane of symmetry of the magnetic doublet. Since the same symmetry conditions are used for both the electrostatic and magnetic fields, the performance of the magnetic doublet is not compromised. Electrode configurations which provide more intense fields provide further reduction in aberrations for a given potential superimposed on the accelerating voltage.

11 Claims, 6 Drawing Sheets

MAGNETIC-ELECTROSTATIC SYMMETRIC DOUBLET PROJECTION LENS

BACKGROUND OF THE INVENTION

1. Field of the Invention

The present invention generally relates to charged particle projection systems and, more particularly, to projection lenses for electron beam and lithography tools.

2. Description of the Prior Art

Numerous industries, especially semiconductor integrated circuit manufacturing, rely on lithographic processes in which a pattern of material is deposited on or removed from a surface, such as etching a pattern into a substrate or a blanket layer of material. Lithographic processes are also used to make masks which may then be used in other lithographic processes. Generally, a layer of resist is applied to a surface and a selective exposure made of areas of the resist layer. The resist is then developed chemically to form a mask by removing either exposed or unexposed areas of the resist (depending on whether the resist is a positive or negative resist) and a material deposited or removed in a pattern corresponding to the mask such as by etching, implantation, chemical vapor deposition (CVD) or the like, possibly enhanced by the presence of a plasma.

To produce very fine features (e.g. fine pitch, small feature size and the like) very high resolution exposure is required. Resolution in optical exposure systems is limited by the wavelength of the radiation used to make the exposure as well as other physical effects presented by the exposure medium. Alternatively, beams of ions or electrons have been used to produce exposures at finer resolution than can be accomplished using even short wavelength (e.g. deep ultraviolet) light. Electron beam exposure is also convenient for complex patterns since an electron beam can be rapidly and accurately deflected by electrical and/or magnetic fields to serially expose selected areas of the resist such as in direct writing or step-and-repeat processes using a mask for shaping the electron beam.

However, some practical limitations on resolution are also characteristic of electron beams. Suitable resists for electron beam exposure require a significant electron flux (e.g. the number of electrons) for exposure and, as alluded to above, the exposure of respective areas is done serially. Therefore, throughput of an electron beam (hereinafter sometimes "e-beam") tool is limited by the beam current which can be developed. However, the charge carried by each electron or ion causes a repulsive force between the like-charged particles (generally referred to as Coulomb interactions) which increases with proximity between particles. Accordingly, high density of electron population in the electron beam causes aberrations in the nature of blurring or defocussing in the beam image because of the interactions between the electrons. Therefore, there is a trade-off between resolution/aberrations and maximum beam current and throughput.

At the present time, there are three principal approaches to increasing the useable beam current while containing electron interaction aberrations to a significant degree. Two of these approaches effectively rely on reduction of the average beam current density. The first approach involves the projection of relatively large sub-fields to maintain throughput at lower current density and, if the sub-field is sufficiently large, increased total beam current can be employed without severe detrimental effects of high current density. The second is to use a large numerical aperture which corresponds to a large beam semi-angle at the target (e.g. the average cross-section of the beam is large and sharply converged only shortly before the target through a large angle to the beam axis).

Both large sub-field sizes and large beam semi-angles put stringent demands on the aberration performance of the projection lens if high resolution is to be achieved since the geometric aberrations also increase with field size and beam semi-angle. Therefore there is an additional trade-off between geometric aberrations and electron interaction aberrations. These conflicting aberration requirements have led to adoption of a particular projection lens configuration known as a magnetic symmetric doublet. This type of lens configuration has particularly good geometric aberration performance which arises from the symmetry of the magnetic fields about the position of the common focal point or plane of symmetry of the two lenses of the doublet. If there is parallel illumination of the reticle (e.g. the illumination source is at infinity) the symmetry plane of the doublet coincides with the entrance pupil of the system. Depending on the type of reticle used in the projection system, there may be a physical aperture at the entrance pupil or, alternatively, the entrance pupil may be an image of a physical aperture which is in the illumination optics above the reticle.

More specifically, if the magnetic doublet has a magnification, m, and a z coordinate axis is defined along the axis of the cylindrically symmetric magnetic doublet lens with the origin at the plane of symmetry or entrance pupil, the required symmetry can be expressed as:

$$\vec{B}(-z) = -(1/m)\vec{B}(z*m) \qquad \text{Equation 1}$$

It can be shown that this symmetry relationship minimizes many of the aberrations of the projection lens, including, in particular, all the anisotropic aberrations and isotropic distortion. The relevant aberration integrals are provided in standard texts.

However, while the magnetic doublet provides good geometric aberration performance and thus allows some latitude in accommodating the trade-off between Coulomb interaction aberration (loss of resolution) and beam current (loss of throughput), throughput remains limited by resolution requirements, particularly as advances in integration density require smaller feature sizes and finer pitches.

A third approach to the trade-off which allows increase of resolution at a given throughput is to increase beam energy (e.g. a high accelerating potential for the beam). Geometric aberrations (with the exception of chromatic aberrations) are unaffected by beam energy while the trajectory displacement (TD) aberration due to Coulomb interactions and chromatic aberrations decreases with increased beam energy. As the approaches discussed above reduce electron proximity by increasing the beam cross-sectional area at a given current, increased electron energy decreases the time required for an electron to traverse the beam length and allows less time over which the Coulomb interactions can develop electron displacements and consequent aberrations. This can also be conceptualized as a decrease in electron density in the axial direction of the beam. Relativistic effects at high acceleration voltages further reduce TD aberrations. The relativistic contribution to the TD aberrations can be characterized by the parameter $\Gamma$ where $\Gamma = 1 + \text{Vac}/511$ (Vac in kilovolts). Monte-Carlo calculations of the TD predict a $(\text{Vac})^{-1.3}(\Gamma)^{-1.2}$ dependence on beam accelerating voltage at constant beam current.

Unfortunately, resist sensitivity effectively declines with increased beam energy and increased beam current is needed for a given throughput, thus conflicting with the gain from increased beam energy. Therefore overall performance (considering both throughput and resolution) increases more slowly with increasing beam energy. Assuming that beam current must increase linearly with Vac to maintain constant throughput, Monte-Carlo calculations of TD predict a $(Vac)^-_{0.6} (\Gamma)^{-1.2}$ dependence on beam voltage at constant throughput.

Additionally, there are further practical difficulties with increasing beam energy and beam current since power dissipation is increased in lenses, deflectors, apertures and at the target and may not necessarily be accommodated. Moreover, at high beam accelerating voltage, it becomes increasingly difficult to provide reticle illumination with the necessary uniformity and beam semi-angle. Likelihood of beam damage of the reticle or mask is also increased and is believed to impose an upper limit on beam energy at the reticle of about 170–200 kV.

Conversely, reduced beam energy would allow economies throughout the e-beam system and, furthermore, a reduction in beam current since the resist sensitivity is effectively increased at lower beam energy. Unfortunately, with currently known projection lenses, axial chromatic aberration and TD aberration tend to increase as beam energy is reduced. Therefore currently known projection lenses which maintain constant beam energy throughout the trajectory are constrained to operate between a lower limit on beam energy imposed by TD and chromatic aberration and an upper limit on beam energy imposed by electron damage of the reticle and electron damage and power dissipation in the target.

In summary, currently known projection lenses are limited in their capacity for low geometric aberrations, low TD aberrations, low beam energy and high throughput. Further, currently known projection lenses cannot support further improvement in resolution without a severe reduction in throughput.

SUMMARY OF THE INVENTION

It is therefore an object of the present invention to provide an electron beam projection lens having reduced aberration and increased resolution without necessitating reduction in throughput.

It is another object of the invention to provide an e-beam projection lens having reduced chromatic aberration at reduced beam energy.

It is a further object of the invention to provide an e-beam projection lens having improved resolution and minimal distortion for a given beam current and beam landing energy.

It is a yet further object of the invention to maintain geometrical aberration performance of a charged particle beam projection system at reduced beam landing energy.

In order to accomplish these and other objects of the invention, a charged particle beam projection system is provided including a symmetric magnetic doublet projection lens having a symmetry condition expressed by $Bz(-z) = -(1/m) Bz(z*m)$, where $z=0$ at a symmetry plane, and an arrangement for providing a non-uniform electrostatic field through the symmetric magnetic doublet projection lens to provide a maximum velocity of charged particles approximately at the symmetry plane of the symmetric magnetic doublet projection lens.

In accordance with another aspect of the invention a method for operating a symmetric magnetic doublet charged particle projection lens to reduce distortion or aberration and/or at reduced beam current is provided by accelerating and decelerating a charged particle beam with generally symmetrical electrostatic fields on opposite sides of a symmetry plane of the symmetric magnetic doublet lens.

BRIEF DESCRIPTION OF THE DRAWINGS

The foregoing and other objects, aspects and advantages will be better understood from the following detailed description of a preferred embodiment of the invention with reference to the drawings, in which:

FIG. 3 is a graphical illustration of an exemplary electric field complementary to the magnetic field of FIG. 2 in accordance with the invention.

DETAILED DESCRIPTION OF A PREFERRED EMBODIMENT OF THE INVENTION

Figure 1:
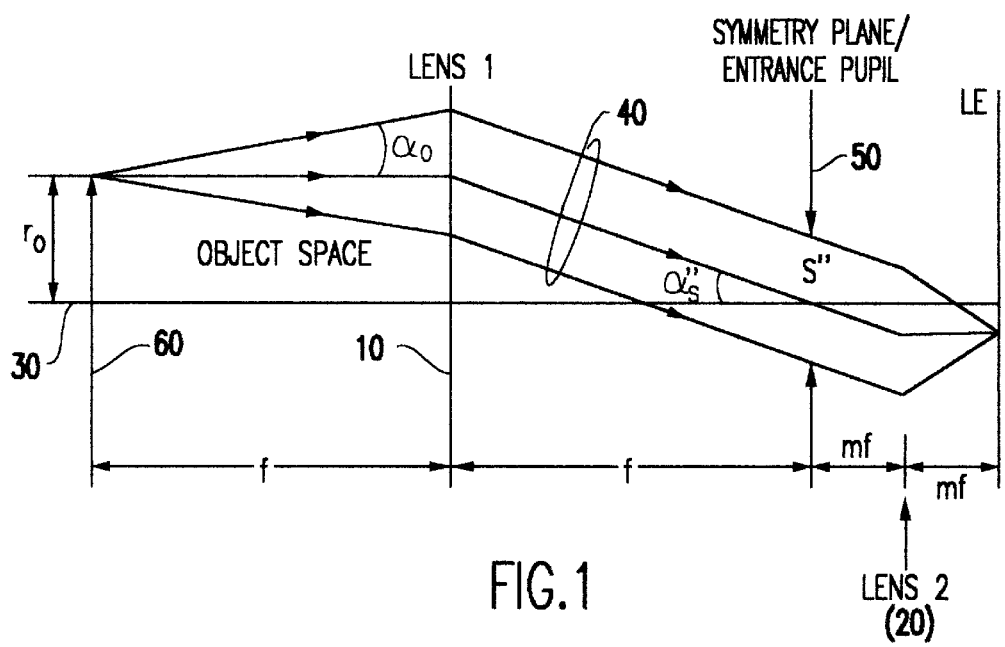
FIG. 1 is an idealized schematic diagram of a magnetic doublet having an arbitrary magnification factor, m (implicitly illustrated as m=0.5) and an electron beam passing there through, FIG. 2 is a graphical illustration of an exemplary magnetic field utilized in a magnetic doublet projection lens.

Referring now to the drawings, and more particularly to FIG. 1, there is schematically shown a symmetric magnetic doublet projection lens and an idealized electron beam passing therethrough useful in understanding the invention. It is to be understood that while magnetic doublets are known and depictions in the general form of FIG. 1 can be found in standard texts, the depiction of FIG. 1 is also illustrative of the invention and its operation, particularly since the depiction of the electron beam is idealized. Therefore, no portion of any Figure is admitted to be prior art in regard to the present invention.

The magnetic doublet of FIG. 1 comprises two magnetic lenses at locations 10 and 20 having a common axis 30 for controlling electron beam 40. The two lenses of the doublet are disposed on opposite sides of a symmetry plane 50 which may coincide with an entrance pupil, as alluded to above. The locations of the two lenses could be symmetrically located for a magnification ratio of 1:1 but may be disposed at different distances from the plane of symmetry 50 (using lenses of correspondingly scaled focal lengths of f and m*f, respectively) for other magnification ratios and thus maintaining symmetry of the doublet. In this regard, it should be noted that each lens 10, 20 is located midway between the symmetry plane 50 and the object plane 60 (sometimes referred to as the reticle plane) or the image plane 70 (sometimes referred to as the target plane), respectively.

Since the electron beam trajectory is geometrically similar between the lenses on opposite sides of the symmetry plane or entrance pupil (e.g. angle $\alpha_s$ is the same on both sides of the entrance pupil), the magnification, m, will be the ratio of $r_1$ to $r_0$.

Figure 2:
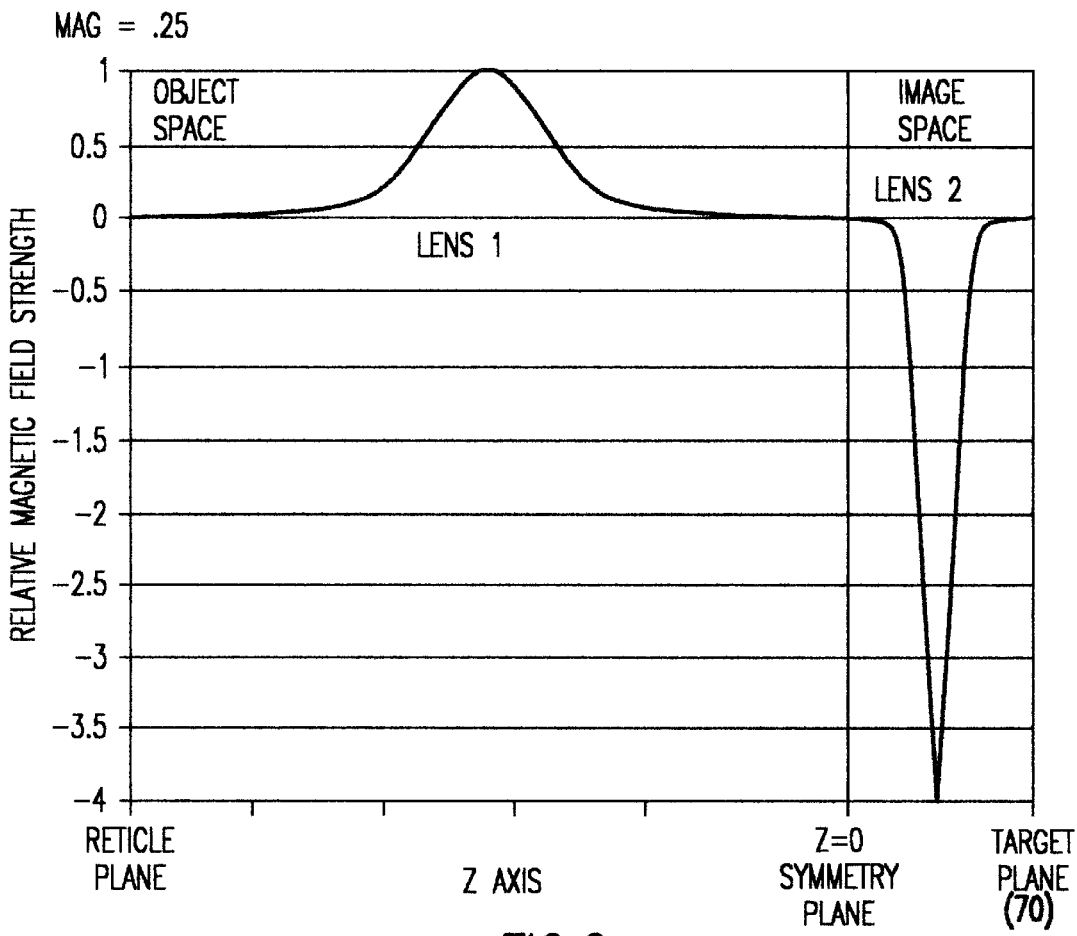

As indicated above, lenses 10 and 20 are both converging lenses with focal lengths of f and m*f, respectively. Corresponding exemplary magnetic fields are illustrated in FIG. 2. The bell shape of the magnetic field of each lens, as illustrated, is not at all critical to the practice of the invention and is chosen for clarity, familiarity to those skilled in the art and simplicity of computer simulations of the performance of the symmetric magnetic doublet and the invention as will be discussed below. (Also for convenience and clarity of illustration, FIGS. 1–2 are of the same axial scale and aligned in accordance with the locations of the lenses and entrance pupil of the doublet.) The exact shape and magnitude of the magnetic field will be determined by the geometry of the lens pole pieces, the lens coil and the like and current passed therethrough as is well-understood in the art. Accordingly, the details of the configurations of the lens pole pieces and coils are not at all critical to the practice of the invention although the symmetry relationship, as defined in Equation 1, between the fields of the two lenses is important, and techniques for fabrication of lenses to obtain the required symmetry are known in the art.

It should be understood that known magnetic doublet e-beam lenses do not include any particular electric field as an incident of their design but serve to image the moving electrons by a magnetic field only. Known magnetic doublets therefore maintain constant electron energy from the reticle plane 60 to the target plane 70. The invention includes the superposition of an electrostatic field on the magnetic field of the doublet; the electrostatic field having substantially the same symmetry about the symmetry plane 50 as the magnetic field. Furthermore, the electrostatic field must be accelerating for the particles between the reticle and the symmetry plane and decelerating for the particles between the symmetry plane and the target. Using the standard sign convention for electric fields, for the case of electrons, a predominately (as defined below) negative field to the left of the symmetry plane and a predominately positive field to the right of the symmetry plane is required.

In this regard, it should be noted that the field between the reticle and symmetry plane could be composed of a mixture of accelerating segments and decelerating segments but it is essential for the invention that the accelerating parts predominate prior to the symmetry plane in the sense that the particles are caused to move faster at the symmetry plane than at the reticle. The converse, of course, applies to the field between the symmetry plane and the target to slow the particles by the same amount as they have been accelerated prior to the symmetry plane. For positively charged particles the field polarities would be the opposite, so that, again, the particles are accelerated between the reticle and the symmetry plane decelerated between the symmetry plane and the target. The preferred ideal symmetry conditions for the electrostatic field for a given magnification, m, is expressed as (assuming negatively charged particles):

$$\vec{E}(-z) = -(1/m)\vec{E}(z*m) \quad \text{Equation 2}$$

and $$\bar{E}_z(-z) < 0. \quad \text{Equation 3}$$

where $\bar{E}_z$ is the average axial electrostatic field between reticle and symmetry plane.

Figure 3A:
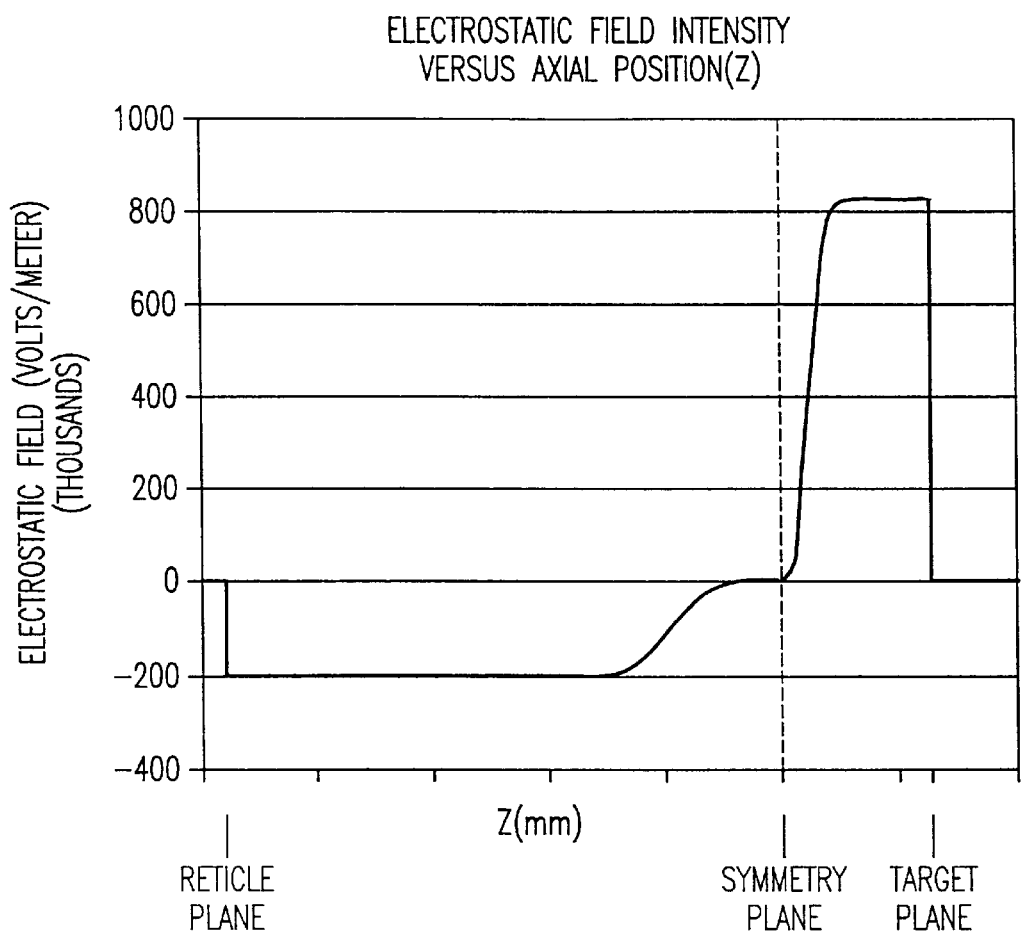
FIG. 3A shows the electric field intensity as a function of axial position.
Figure 4A:
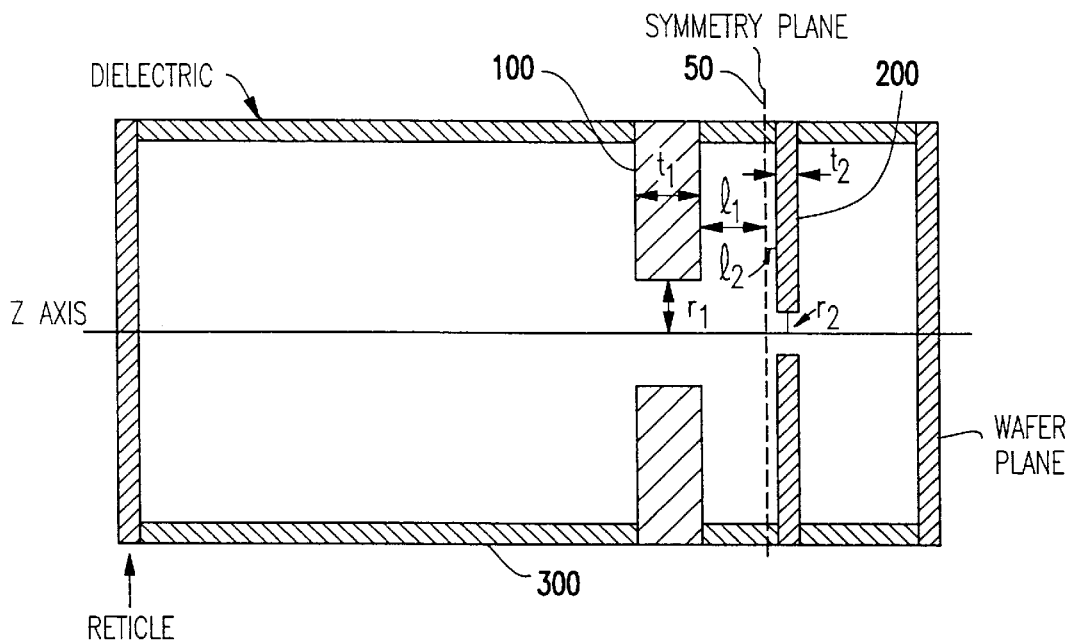
FIG. 4A is a cross-sectional view of a pair of exemplary electrodes suitable for production of an electrostatic field having a symmetry in accordance with the principles of the invention.
Figure 4B:
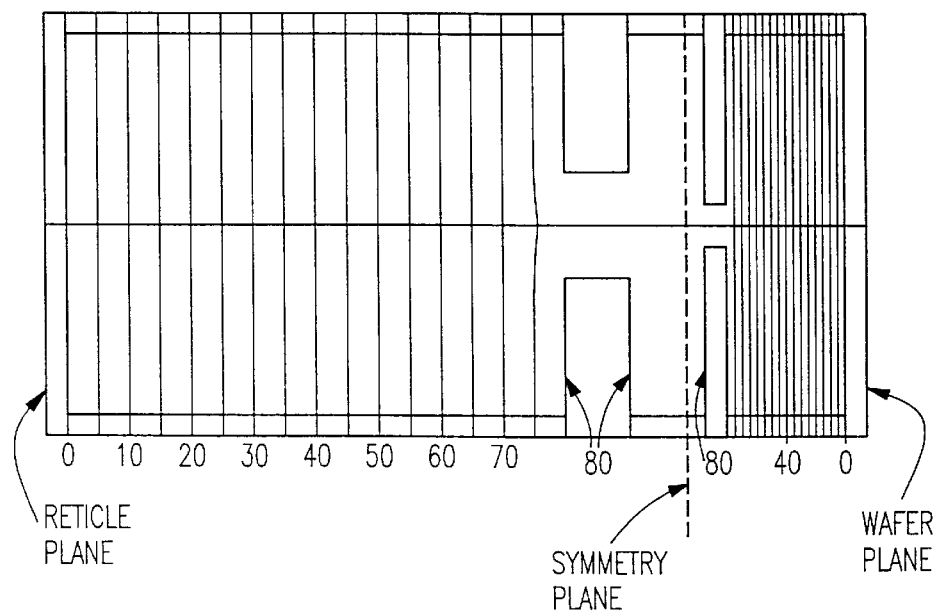
FIG. 4b illustrates equipotentials of the calculated electrostatic fields when a voltage is applied to the electrodes of FIG. 4a, FIG. 5 illustrates dependency (decrease) of aberrations of the magnetic-electrostatic doublet with increase of voltage on the electrodes of the arrangement of FIG. 4a, FIG. 6 is an alternative embodiment of the invention including electrodes suitable for production of an electrostatic field of the required symmetry.

An electrostatic field profile having the desired symmetry conditions for the preferred implementation of the invention is illustrated in FIG. 3A. It will be understood by those familiar with the art that the required electrostatic field symmetry can be obtained by use of biased electrodes disposed about the symmetry plane. A preferred method of obtaining such a field profile is to choose pairs of electrodes differing in dimensions and location only by the scale factor m. These electrodes are positioned along the axis of the system and respectively separated from the symmetry plane by distances with the ratio m (e.g. $l_2/l_1$) as shown in FIG. 4A. In the cross-sectional view shown in FIG. 4A, the electrodes are disk shaped with a central hole, the axis of which is aligned with the axis of the system. The electron beam is assumed to travel from left to right from the reticle to the target. A doublet with a magnification m=0.25 is illustrated. Electrode 100 has a thickness, $t_1$ and central hole of radius $r_1$, and is positioned at distance $l_1$ to the left of the symmetry plane. Electrode 200 has a thickness of $t_2=t_1*m$, and a central hole of radius $r_2=r_1*m$ positioned at a distance $l_2=l_1*m$ to the right of the symmetry plane. Electrodes sized and positioned in this way can produce electrostatic fields of the required symmetry while being biased to the same voltage, as shown in FIG. 4B. Other techniques for developing the required symmetry will be apparent to those skilled in the art; the configuration of FIG. 4a being shown as, perhaps, the simplest way of doing so.

For example, multiple electrodes could be used above/left and below/right of the symmetry plane 50 but for each electrode to the above/left of the symmetry plane 50, there must be a corresponding electrode below/right the symmetry plane, the corresponding electrode being sized, positioned and biased so as to ensure field symmetry as described above. Moreover, the electrode shapes are not limited to disks with central apertures, but can be of any shape possessing effective cylindrical symmetry about a central axis (e.g., the shape of the outer perimeter becomes less important with diameter).

The exact shape of the superposed electrostatic field is of secondary importance in comparison with the field symmetry and the field strength as will be illustrated by calculations with commercially available software. Further, exact matching of the magnetic field symmetry with the electrostatic field symmetry is not necessary in order to obtain substantial improvement over known magnetic doublets as will be described below with reference to FIG. 7.

Figure 3B:
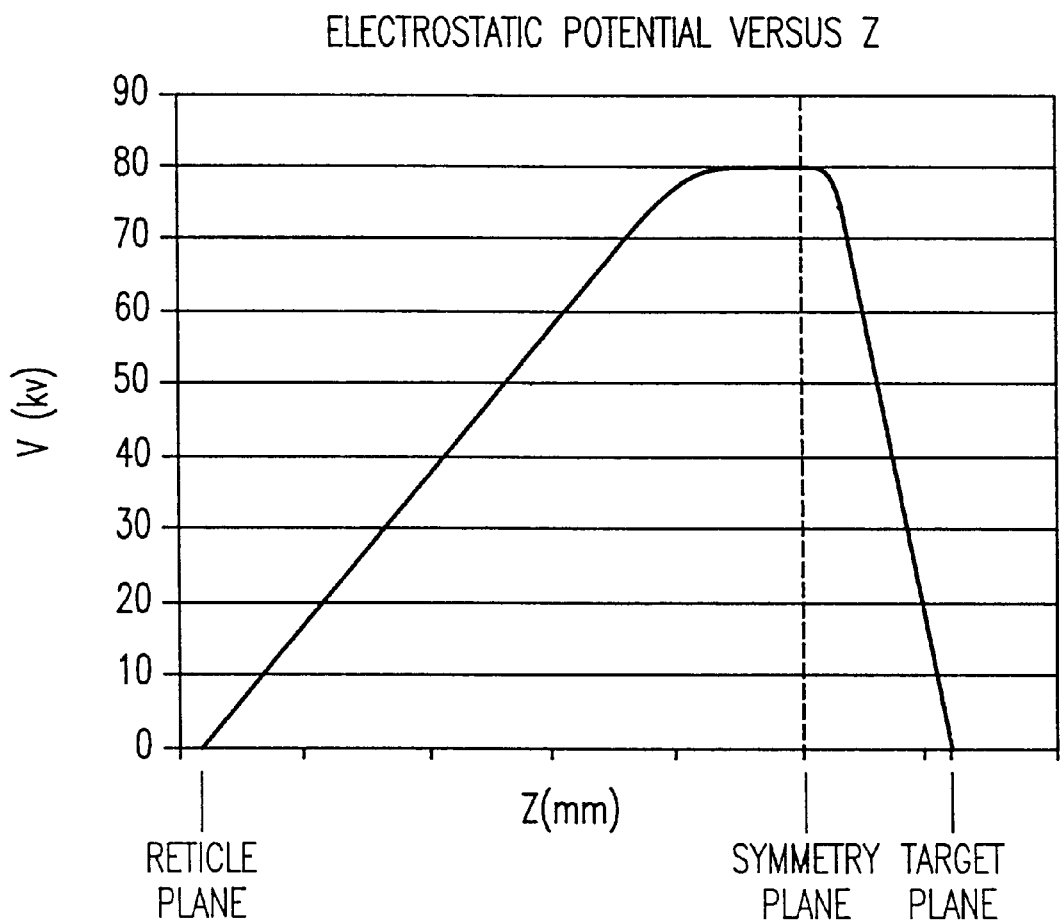
FIG. 3b is a corresponding graphical representation of the electrostatic potential as a function of axial position.

The fields of the electrode arrangement illustrated in FIG. 4A were calculated and used to further calculate the aberrations of the magnetic-electrostatic doublet in accordance with the invention. In calculating the fields, the reticle and the target are assumed to be electrically conducting, to be planar and to be at ground potential. These conditions correspond to the typical situation in an electron beam projection system and do not limit the usefulness of the invention under other conditions which can be similarly simulated. Further, it is assumed that the electrostatic potential varies linearly between the electrodes along the outside perimeter of the lens. This assumption can be realized in practice by making the outer diameter of the electrodes large compared to the bore ($2r_1$). Other alternatives are also known in the art for producing the required inter-electrode fields, such as a resistive coating on the interior of the insulating tube 200, a series of biased electrodes and the like. A positive potential, Ve, is applied to both electrodes 1 and 2 and the resulting field is calculated. The electrostatic field is illustrated in FIG. 4b by selected equipotential lines starting at 0 kV at the reticle and at the target and progressing in 5 kV increments to +80 kV at electrodes 1 and 2. FIG. 3 illustrates the same field in terms of electrostatic field intensity as a function of axial position. Similarly, FIG. 3B illustrates the same field in terms of electrostatic potential.

Figure 5:
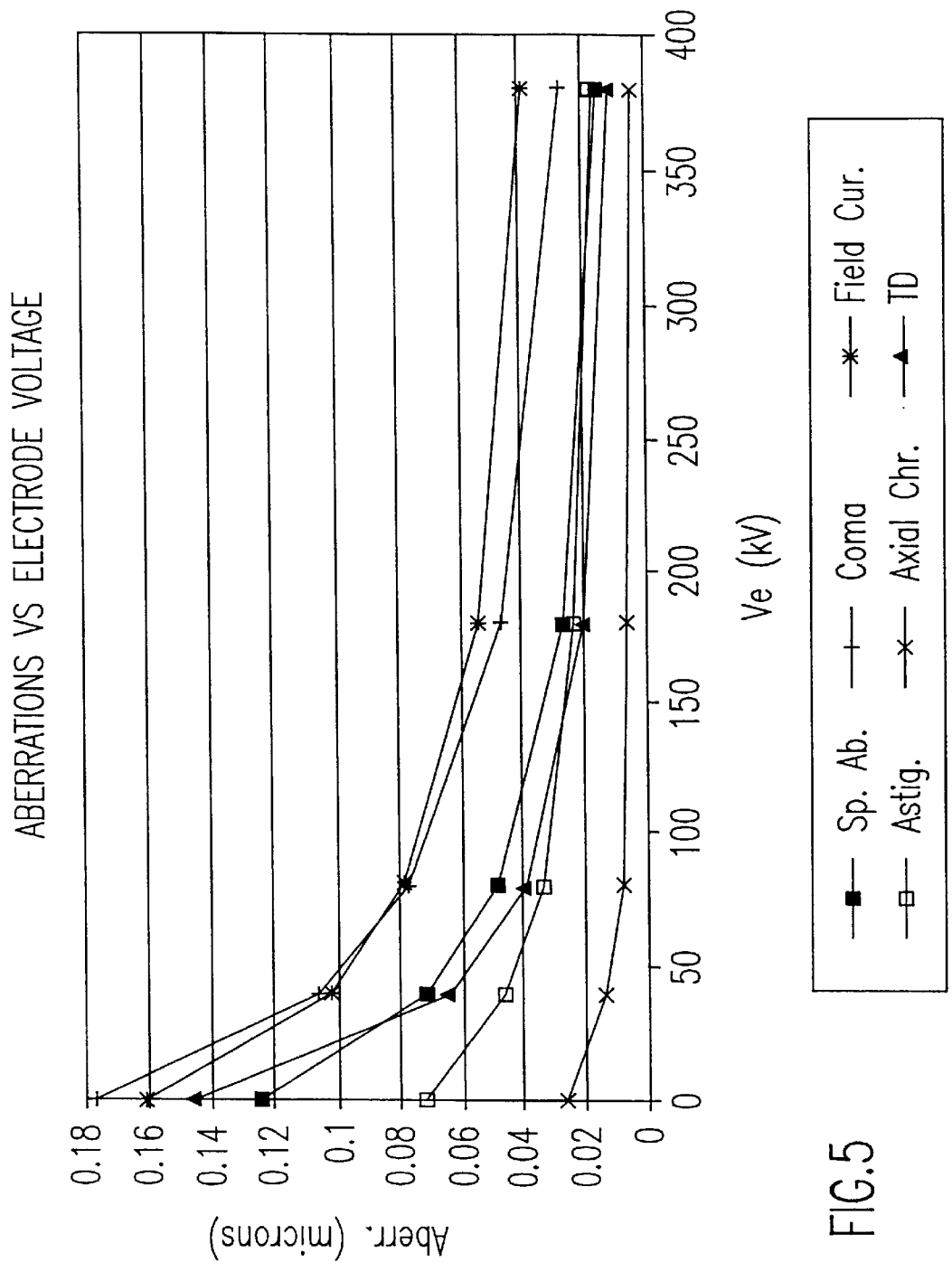

The optical properties of the magnetic-electrostatic doublet can be similarly calculated. For the calculation, a relatively low energy beam of 20 kV accelerating potential is assumed incident at the target. The tabulated values given in Table A, also shown in graphical form in FIG. 5, are the aberrations in the Gaussian image plane at the corner of a 0.25 mm by 0.25 mm field, assuming an 8 milliradian (mrad) beam semi-angle at the target, and an energy spread in the beam of 1 V. The calculated doublet has a magnification 0.25, and a length of 600 mm from reticle to target.

TABLE A

|  | I | II | III | IV | V |
|---|---|---|---|---|---|
| Ve (kV) | 0 | 40 | 80 | 180 | 380 |
| $\bar{V}$ | 20 | 43 | 67 | 125 | 242 |
| TD | 0.147 | 0.056 | 0.028 | 0.010 | 0.003 |
| Aberrations (micrometers) |  |  |  |  |  |
| Spherical | 0.125 | 0.072 | 0.049 | 0.026 | 0.013 |
| Coma | 0.178 | 0.107 | 0.077 | 0.046 | 0.026 |
| Field Curvature | 0.162 | 0.103 | 0.079 | 0.054 | 0.038 |
| Astigmatism | 0.073 | 0.046 | 0.034 | 0.023 | 0.015 |
| Distortion | 0.000 | 0.000 | 0.000 | 0.000 | 0.002 |
| Axial Chromatic | 0.028 | 0.013 | 0.008 | 0.005 | 0.002 |

In table A, Ve is the voltage applied to electrodes 1 and 2, $\bar{V}$ is the average axial electrostatic potential in kV between the reticle and the target, Td is the expected trajectory displacement calculated as described below, and the remaining rows are the dominant geometrical aberrations of the system. A commercially available Monte Carlo program is used to calculate the trajectory displacement aberration for the case in column I of the table, i.e. Vacc=20 kV, Ve=0, beam current=4 µA. TD aberration for columns II through V are calculated from column I assuming TD scales as $$\bar{V}^{0.6} \Gamma^{-1.2}$$

Thus, in Table A, column I reflects the simulated performance of a magnetic doublet without the superposed electrostatic field in accordance with the invention (e.g. Ve=0) and thus represents the known, ordinary magnetic doublet described above. A bell shaped magnetic field of the form $$B_2 = B\max*(1+z/a)^{-3}$$

with a=100 mm was assumed. All parameters of the simulations in respective columns of the table are held constant except Ve, the voltage applied to the electrodes and the magnetic field strength which is adjusted (increased) to the value needed to focus the beam at the target. The five columns thus represent the performance of the lens with a constant beam energy at the reticle and the target and sequentially increased values of Ve.

It can be readily appreciated from the tabulated results of Table A that all significant aberrations of the magnetic doublet are reduced as the electrode potential is raised. Since the electrode potential (e.g. Ve) has no effect on the beam energy at the reticle or at the target, there is, in principle, no upper limit on the useable electrode potential and, therefore, arbitrarily good resolution can be theoretically obtained. However, as the electrode potential Ve is increased, the difficulty of insulating the high voltage increases as well as the difficulty of providing the excitation currents required in the magnetic lenses and deflectors for focusing and deflecting the beam, respectively. Thus, in practice, Ve would be chosen where the cost of increased insulation structure and increased cost of lens excitation and deflection yoke current would exceed the resolution benefit.

Figure 6:
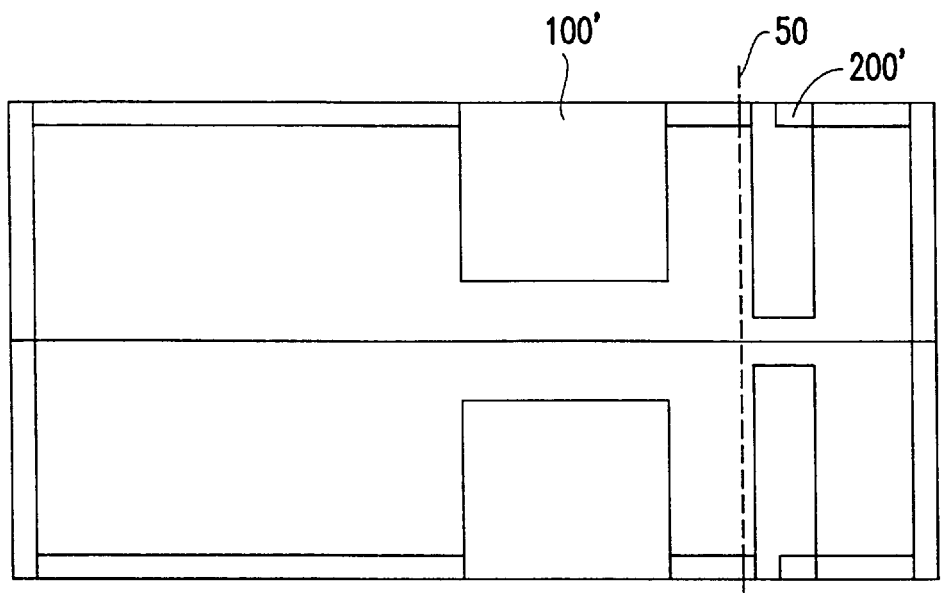

While shape or configuration of the electrode is not at all critical to the practice of the invention, to illustrate the effect of the shape of the electrostatic field on the doublet performance, a second geometric configuration of electrodes, illustrated in FIG. 6, was calculated. The electrodes 100', 200' in FIG. 6 differ from the electrodes 100, 200 illustrated in FIG. 4 only in their thickness. However, for a given applied voltage Ve, these electrodes create a stronger accelerating field in the space between the reticle and the upper/left electrode and correspondingly stronger decelerating field in the space between the lower/right electrode and the target. The aberrations for the two sets of electrodes for Ve=180 kV are as follows:

TABLE B

|  | FIG. 4 | FIG. 6 |
|---|---|---|
| Aberrations (micrometers) |  |  |
| Trajectory Disp. (TD) | 0.010 | 0.009 |
| Spherical | 0.026 | 0.017 |
| Coma | 0.046 | 0.032 |
| Field Curvature | 0.054 | 0.045 |
| Astigmatism | 0.023 | 0.018 |
| Distortion | 0.000 | 0.001 |
| Axial Chromatic | 0.005 | 0.003 |

In comparing the two systems which have the same throughput and TD aberration, the system utilizing the magnetic-electrostatic doublet is markedly superior for all geometric aberrations except axial chromatic aberration. Axial chromatic aberration is relatively unimportant for most practical cases of interest where bean energy spread is a few electron volts or less. Accordingly, it is seen that aberrations are reduced for the configuration with shorter, more intense fields with only slight and generally negligible effect on distortion.

To illustrate the significance of the reduced aberrations of the magnetic-electrostatic doublet in comparison with a known magnet doublet, systems with the same throughput and TD aberration are compared in Table C. Column I of Table C is for the magnetic-electrostatic doublet of Table A, Column IV. Column II of Table C illustrates a conventional magnetic doublet which must operate at 500 kV, 100 µA beam current to provide identical throughput at the same TD aberration.

TABLE C

|  | I | II |
|---|---|---|
| Vac (kV) | 20 | 500 |
| Ve (kV) | 180 | 0 |
| $\bar{V}$ (kV) | 110 | 500 |
| I (microAmperes) | 4 | 100 |
| Target Power (Watts) | .8 | 50 |
| Absorption Aberrations (micrometers) |  |  |
| TD | .010 | .010 |
| Spherical | .026 | .125 |

TABLE C-continued

|  | I | II |
|---|---|---|
| Coma | .046 | .178 |
| Field Curvature | .054 | .162 |
| Astigmatism | .023 | .073 |
| Distortion | .000 | .000 |
| Axial Chromatic | .005 | <.005 |

It is significant to note that the superiority of the electrostatic-magnetic doublet in accordance with the invention over the ordinary magnetic doublet is achieved at a significantly reduced acceleration voltage. As discussed above, a reduced beam energy or Vacc at the target allows utilization of a higher sensitivity of the resist and permits a reduced beam current to be used. Reduced beam energy also would result in increase of efficiency and economy in every element of the e-beam system or other charged particle projection systems. Of special importance is the relatively low target power absorption with system I in accordance with the invention since target temperature changes must be avoided to prevent beam placement errors due to target expansion or contraction.

However, it should be understood that the optimal choice of beam energy and electrode potential depends on the energy spread of the source, the field size, aperture angle and how TD aberration changes as a function of the other parameters, as will be apparent from the above exemplary embodiments. Other configurations and operating parameters can be extrapolated therefrom by those skilled in the art in view of the above description of the invention. Near optimum values and potential profile shapes can be extrapolated from empirical results based on very few trials or by simulation of variant configurations using commercially available electron-optical system simulation programs.

Figure 7:
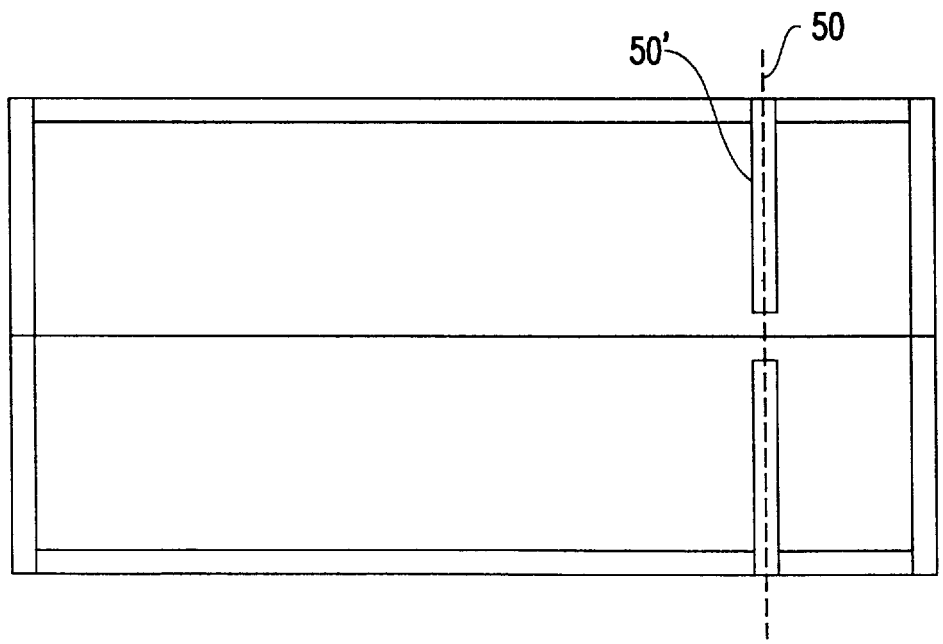
FIG. 7 is an alternative embodiment of the invention including electrodes suitable for production of an electrostatic field of approximately the symmetry in accordance with the invention and adequate to the practice thereof.

It should also be appreciated that the symmetry conditions assumed need not be exact, in practice, and approximations of the ideal symmetry conditions should also provide significant improvement over known systems in view of the substantial improvement over known systems apparent from simulations. An example of an electrode structure which provides an electrostatic field approximating the required doublet symmetry is illustrated in FIG. 7. A single, thin, disk-shaped electrode 50' is placed at the symmetry plane 50. The required symmetry deviates from the "ideal" symmetry in accordance with the principles of the invention only in the immediate vicinity of the symmetry plane and then only to the extent that magnification, m, differs from 1. Calculations of the fields and aberrations show similar trends toward the effects produced by the more exact solutions shown in FIGS. 4 and 6.

It is also structurally convenient to provide for placement of the maximum of the electrostatic potential profile at the symmetry plane or entrance pupil since many e-beam and charged particle projection systems include a physical aperture at the entrance pupil location to remove scattered electrons from the beam, as illustrated in FIG. 1. Therefore, the physical aperture can be provided as the electrode to which a potential (Ve) can be applied to establish the electrostatic field.

In view of the foregoing, it is seen that the invention provides improved optical performance of a symmetric magnetic doublet in unexpected degree as well as the counter-intuitive reduction of chromatic aberration at reduced beam currents which can be used while maintaining throughput at reduced beam energy. The improvement in performance allows increases in currently available throughput of a charged particle projection system or tool while maintaining aberrations to a very small fraction of current and foreseeable feature sizes and pitches.

While the invention has been described in terms of a single preferred embodiment and variations thereon, those skilled in the art will recognize that the invention can be practiced with modification within the spirit and scope of the appended claims.

Having thus described my invention, what I claim as new and desire to secure by Letters Patent is as follows:

1. A charged particle beam projection system including a symmetric magnetic doublet projection lens having a symmetry condition expressed by $Bz(-z)=-(1/m) Bz(z*m)$, where $z=0$ at a symmetry plane, and means for providing a non-uniform electrostatic field through said symmetric magnetic doublet projection lens to provide a maximum velocity of said charged particles at approximately a location of said symmetry plane of said symmetric magnetic doublet projection lens.

2. A system as recited in claim 1, wherein said means for providing a non-uniform electrostatic field includes means for providing an accelerating potential and accelerating electrostatic field for accelerating charged particles, thus determining energy of a charged particle beam, and means for superimposing a non-uniform electrostatic field on a magnetic field of said symmetric magnetic doublet, said non-uniform electrostatic field having a potential greater than said accelerating potential.

3. A system as recited in claim 2, wherein said non-uniform electrostatic field has symmetry conditions expressed by $\vec{E}(-z)=(-1/m)\vec{E}(z*m)$ where $z=0$ at said symmetry plane and E is accelerating between the reticle and the symmetry plane, and decelerating between the symmetry plane and the target.

4. A system as recited in claim 1, wherein said non-uniform electrostatic field has symmetry conditions expressed by $\vec{E}(-z)=(-1/m)\vec{E}(z*m)$ where $z=0$ at said symmetry plane and E is accelerating between the reticle and the symmetry plane, and decelerating between the symmetry plane and the target.

5. A system as recited in claim 1, wherein said means for producing a non-uniform electrostatic field comprises a pair of apertured cylindrically-symmetrical electrodes located on opposite sides of said symmetry plane.

6. A system as recited in claim 5, wherein a ratio of thickness of said apertured cylindrically-symmetrical electrodes is approximately equal to a magnification factor of said symmetric magnetic doublet projection lens.

7. A system as recited in claim 6, wherein a ratio of distances of a surface of said apertured cylindrically-symmetrical electrodes from said symmetry plane is approximately equal to a magnification factor of said symmetric magnetic doublet projection lens.

8. A system as recited in claim 5, wherein a ratio of distances of a surface of said apertured cylindrically-symmetrical electrodes from said symmetry plane is approximately equal to a magnification factor of said symmetric magnetic doublet projection lens.

9. A system as recited in claim 1, wherein said means for producing a non-uniform electrostatic field comprises an apertured cylindrically-symmetrical electrode located at said symmetry plane.

10. A method of operating a symmetric magnetic doublet charged particle projection lens having a plane of symmetry and providing magnetic fields having a symmetry about said plane of symmetry, said method including the steps of accelerating said charged particles with a first electrostatic field between a reticle plane and said plane of symmetry, and decelerating said charged particles with a second electrostatic field between said plane of symmetry and a target plane, said first electrostatic field and said second electrostatic field being substantially symmetrical about said plane of symmetry.

11. A method as recited in claim 10, wherein symmetry conditions of said first and second electrostatic fields is approximately the same as symmetry conditions of said magnetic fields.

* * * * *

UNITED STATES PATENT AND TRADEMARK OFFICE
CERTIFICATE OF CORRECTION

PATENT NO. : 6,069,363
DATED : May 30, 2000
INVENTOR(S) : Golladay

It is certified that error appears in the above-identified patent and that said Letters Patent is hereby corrected as shown below:

Column 4,
Line 18, after FIG. delete "3b" and insert -- 3B --;
Line 25, after FIG. delete "4b" and insert -- 4B --;
Line 27, after FIG. delete "4a" and insert -- 4A --;
Line 30, after FIG. delete "4a" and insert -- 4A --.

Column 6,
Line 26, after FIG. delete "4a" and insert -- 4A --;
Line 66, after FIG, delete "4b" and insert -- 4B --.

Signed and Sealed this

Eleventh Day of December, 2001

Attest:

NICHOLAS P. GODICI
Attesting Officer     Acting Director of the United States Patent and Trademark Office